(12) United States Patent
Engelhardt

(10) Patent No.: US 9,866,245 B2
(45) Date of Patent: Jan. 9, 2018

(54) ACTIVE DIFFERENTIAL RESISTORS WITH REDUCED NOISE

(71) Applicant: LINEAR TECHNOLOGY CORPORATION, Milpitas, CA (US)

(72) Inventor: Michael Thomas Engelhardt, Sunnyvale, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 15/236,365

(22) Filed: Aug. 12, 2016

(65) Prior Publication Data

US 2017/0141773 A1    May 18, 2017

Related U.S. Application Data

(60) Provisional application No. 62/257,058, filed on Nov. 18, 2015.

(51) Int. Cl.
*H03K 17/30* (2006.01)
*H04B 1/04* (2006.01)

(52) U.S. Cl.
CPC .................. *H04B 1/0475* (2013.01)

(58) Field of Classification Search
CPC .................................... H03K 17/161
See application file for complete search history.

(56) References Cited

U.S. PATENT DOCUMENTS

| 8,779,864 B2 * | 7/2014 | Ouchi | H03B 9/12 331/107 T |
| 2002/0175273 A1 * | 11/2002 | Moddel | B82Y 10/00 250/214 R |

* cited by examiner

*Primary Examiner* — Kenneth B Wells
(74) *Attorney, Agent, or Firm* — Intelletek Law Group, PLLC

(57) ABSTRACT

A method and system of providing an active differential resistor. The active differential resistor includes a diode having a first node and a second node. There is a capacitor coupled in series between the first node of the diode and an input of the active differential resistor. There is a current source coupled across the first node and the second node of the diode and configured to forward bias the diode such that a Johnson-Nyquist noise of the active differential resistor is replaced by a shot noise.

23 Claims, 4 Drawing Sheets

ACTIVE DIFFERENTIAL RESISTORS WITH REDUCED NOISE

CROSS-REFERENCE TO RELATED APPLICATION

The present application claims the benefit of priority under 35 U.S.C. §119 from U.S. Provisional Patent Application Ser. No. 62/257,058 entitled "Active Differential Resistor with Reduced Noise" filed on Nov. 18, 2015, which is hereby incorporated by reference in its entirety for all purposes.

BACKGROUND

Technical Field

This disclosure generally relates to resistors, and more particularly, to active differential resistors that have reduced noise.

Description of Related Art

Resistors are fundamental and commonly used components in electronic circuits. Passive resistors generate what is known as Johnson-Nyquist or thermal noise. Such noise is generated by the thermal agitation of the charge carriers (e.g., electrons) inside a passive resistor regardless of whether a voltage is applied. Johnson-Nyquist noise is white in that its power spectral density is uniform throughout the frequency spectrum. It is governed by the relationship of Equation 1:

$$V_{John}/\sqrt{Hz} = \sqrt{4kTR} \quad \text{[EQ. 1]}$$

Where:

k is the Boltzmann's constant (joules per kelvin);
T is the resistor's absolute temperature (kelvin); and
R is the resistance of the resistor ($\Omega$).

The Johnson-Nyquist noise is generally considered to be a noise limit of a resistor and therefore an unavoidable source of error and/or undesired random disturbance for many applications that use a resistor. Reducing or overcoming the Johnson-Nyquist noise could dramatically change the application of resistors in various circuits.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 1A and 1B illustrate example active differential resistors that may be used to replace passive resistors.

DETAILED DESCRIPTION OF ILLUSTRATIVE EMBODIMENTS

Figures 2A, 2B:
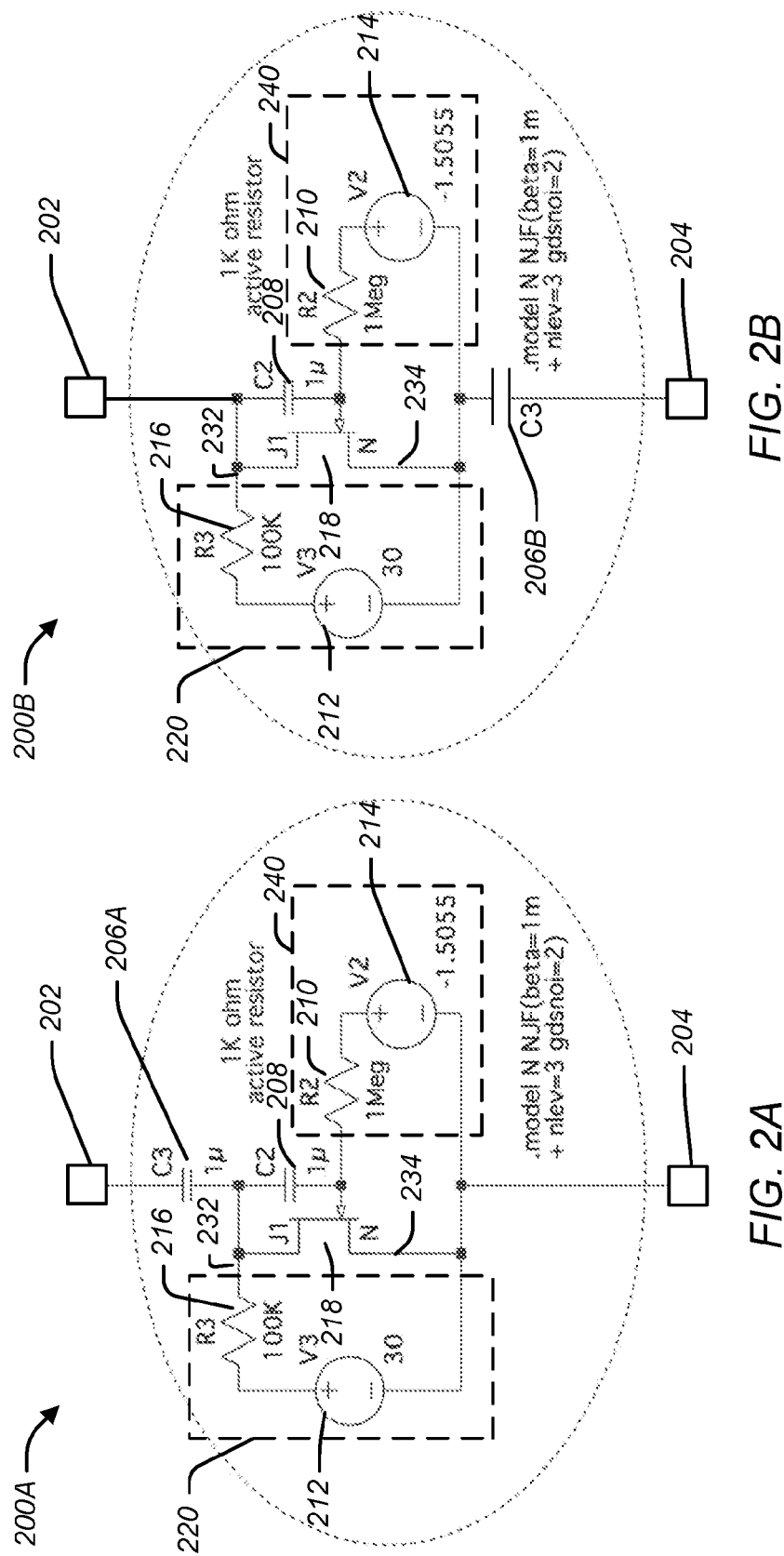
FIGS. 2A and 2B illustrate other embodiments of active differential resistors that use a field effect transistor (FET) as an active component.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings. Some embodiments may be practiced with additional components or steps and/or without all of the components or steps that are described.

The methods and circuits disclosed herein generally relate to methods and circuits of providing low noise resistance elements. More particularly, the present disclosure describes active differential resistors that have less noise than passive resistors. In various embodiments, the active device noise is set by shot noise that can be lower than the Johnson-Nyquist noise of a conventional passive resistor.

In various embodiments, the active differential resistor may include a diode having a first node and a second node. There is a capacitor coupled in series between the first node of the diode and an input of the active differential resistor. There is a current source coupled across the first node and the second node of the diode and configured to forward bias the diode such that a Johnson-Nyquist noise of the active differential resistor is replaced by a shot noise.

In one embodiment, the active differential resistor includes a field effect transistor (FET) having a drain coupled to the input node and a source coupled to the output node. A first voltage source circuit is coupled between the drain and the source of the FET. A second voltage source circuit is coupled between a gate and the source of the FET. The first and the second voltage source circuits are configured to bias the FET into the saturation region such that the Johnson-Nyquist noise of the active differential resistor is replaced by shot noise.

In one embodiment, an active differential resistor includes a FET having a drain coupled to the input node and a source coupled to the output node. There is a transformer having a primary winding and a secondary winding, wherein the first end of the primary winding is connected to a gate of the FET and the first end of the secondary winding is connected to the drain of the FET. Two voltage sources are configured to bias the FET into or near the saturation region such that the Johnson-Nyquist noise of the active differential resistor is replaced by shot noise. The concepts discussed herein ultimately provide a noise-floor that is lower than that of a passive resistor.

Figures 1A, 1B:
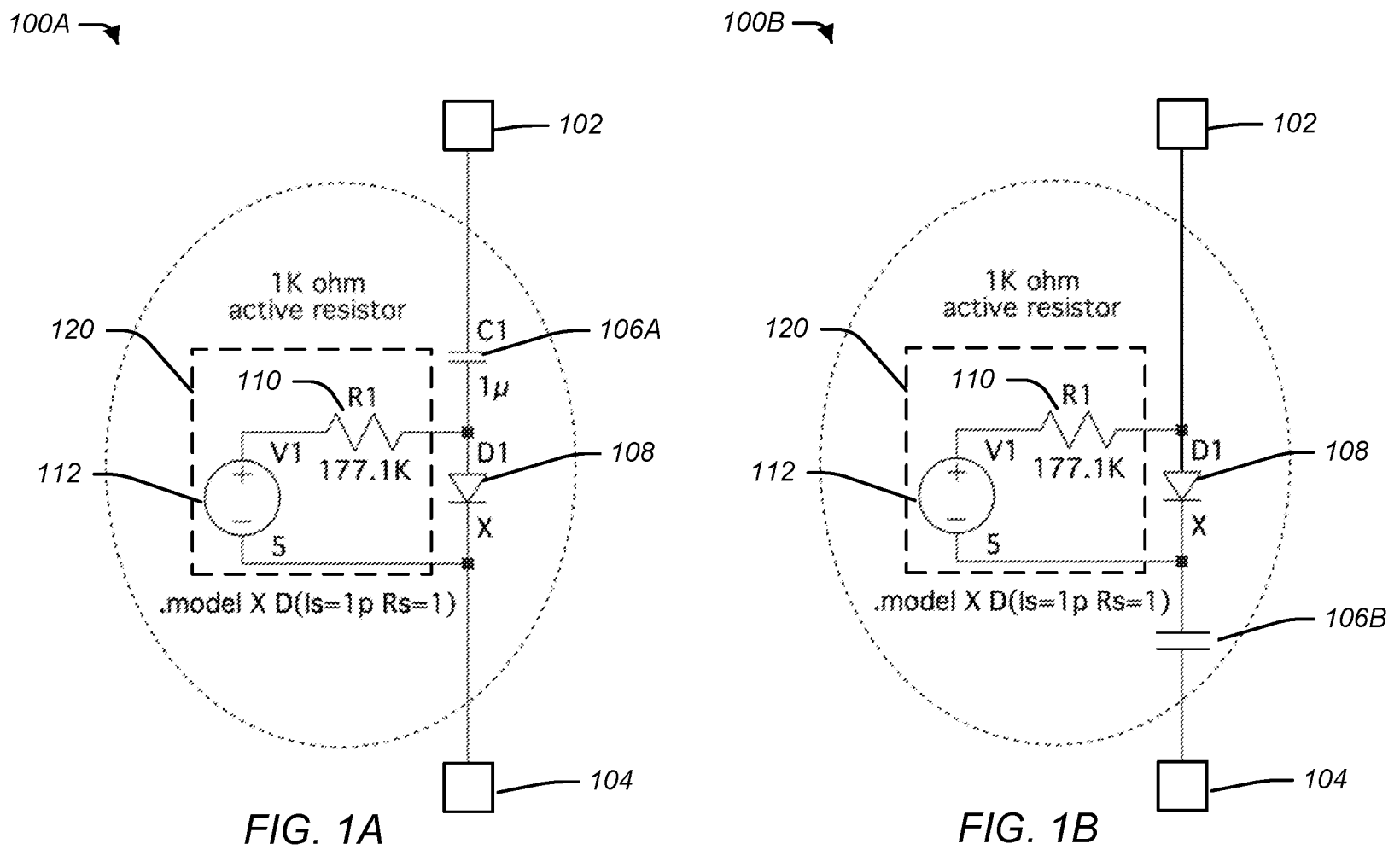

FIGS. 1A and 1B illustrate example active differential resistors 100A and 100B that may be used to replace passive resistors. Active differential resistors 100A and 100B each include a diode D1 (108), a current source 120, and a blocking capacitor 106. In various embodiments, the blocking capacitor C1 may be coupled between a first node 102 and the anode of the diode D1 (108), as illustrated in FIG. 1A, or between the cathode of the diode D1 (108) and the second node 104 of the active differential resistor 100B, as illustrated in FIG. 1B.

The blocking capacitor 106A/B provides more flexibility (e.g., broader application) to the active differential resistor 100A/B in that it decouples the blocking capacitor C1 (106) from any circuit that is coupled between its differential inputs 102 and 104. Put differently, by virtue of the decoupling capacitor C1 (106) the active differential resistor 100A/B can be used in a voltage environment that is independent of the voltage environment of a circuit coupled to the active differential resistor environments.

In one embodiment, the capacitance value of the blocking capacitor C1 (106A/B) is based on the lowest desired frequency of operation of the differential resistor 100A/B.

For purposes of simplicity, the examples of FIGS. 1A and 1B illustrate a diode 108 to be coupled between the first node 102 and the second node 104 of the active differential resistors 100A and 100B, respectively. In this regard, it is noted that other devices having PN junctions can be used instead, including (without limitation) a junction gate field-effect transistor (JFET) where the drain and source are coupled together. For example, the gate can function as the cathode and the drain/source can function as the anode for a p-channel JFET, and the opposite for an n-channel JFET. In another embodiment, a monolithic insulated gate field effect transistor (MOSFET) can be used, where the gate, drain and source are all coupled together and the substrate diode is used in place of diode 108. In yet another embodiment, a vertical field effect transistor (VDMOS) can be used, where the gate and source are coupled together and the body diode is used in place of diode 108.

The active differential resistor 100A/B includes a current source 120 connected across (e.g., in parallel with) the diode 108 such that the current source 120 forward biases the diode 108. By virtue of the current source 120 coupled in parallel to the diode 108, which forward biases the diode 108, the diode 108 is configured to operate as a differential resistance element.

Any suitable current source may be used to bias the diode 108. For example, a current source may include a voltage source 112 coupled in series with a resistor R1 110. It is believed that those skilled in the art are familiar with other suitable current source structures, and they are therefore not discussed here for brevity.

It may be helpful now to provide an example of values of components that may be used to implement active differential resistor to better explain the operation of the active differential resistor 100A/B. The values discussed below are provided by way of example only and not limitation for a 1KΩ resistor. For example, the current source 120 may source about 25.7 uA through the diode D1 (108). In this regard, the impedance between nodes 102 and 104 of the active differential resistor 100A may be nominally 1KΩ at frequencies above 1 KHz. As mentioned previously, the lower frequency at which the active differential resistor 100A behaves as a resistor may be set by the value of the blocking capacitor C1 106A.

The differential resistance of the diode is a function of the current that is running through it. Thus, the differential resistance of the diode can be programmed by the choice of current. Equation 2 below provides a diode expression that is useful to determine the current for a desired resistance value.

$$I(R)=1/(a*R)-I_S \quad [EQ. 2]$$

Where:

$I_S$ represents the saturation current of the diode.

The expression for term "a" is provided by Equation 3 below:

$$a=q/(n*k*T) \quad [EQ. 3]$$

Where:

q is the elementary charge (1.60217662e-19 coulombs);
k Boltzmann's constant (1.38064852 joules per kelvin);
n is the ideality factor (e.g., 1); and
T is the temperature (e.g., 300.15 kelvin).

Solving for "a," one obtains 38.66. Accordingly, when using a diode with a saturation current (i.e., "Is") of $1e^{-12}$A, to obtain a resistance of 1KΩ across the diode D1 (108), the current I(R)=1/(a*R)-Is=25.86 uA.

The stochastic noise density, as provided by the voltage between the first node 102 and the second node 104, is governed by the shot noise current through the diode instead of the Johnson-Nyquist noise of a conventional resistor.

The shot noise current through the diode D1 (108) is converted to a voltage by the impedance of the diode D1 (108). In the present example, this density may be 2.889 nV/Hz½, which is approximately 29% lower than the Johnson-Nyquist noise of a conventional resistor, which may have a noise density of 4.071 nV/Hz½. Thus, by virtue of using a combination of a diode 108 in parallel with a current source 120 and a capacitor 106A/106B coupled to a node of the active differential resistor 100A/100B, the Johnson-Nyquist noise is essentially exchanged with shot noise, which significantly lowers the overall noise of the resistance element.

With the foregoing example, it may now be helpful to provide a mathematical explanation of the improvement in noise between using a conventional resistor and the active differential resistors 100A and 100B disclosed herein. In this regard, the following expressions provide the theory behind the improvement identified by the present disclosure by way of mathematical derivation of the noise of the diode D1 (108).

The current versus voltage I(V) curve of an ideal diode may be given by the expression of Equation 4 below:

$$I(V)=I_S*(e^{(a*v)}-1) \quad [EQ. 4]$$

Where:

I(V) is the current through the diode D1 (108);
$I_S$ represents the saturation current of the diode D1 (108);
V is the voltage across the diode D1 (108); and
a is provided by Equation 3 above.

The conduction of the diode may be expressed as an incremental change of current versus an incremental change of voltage, as provided in Equation 5 below:

$$dI/dV=a*Is*e^{(a*V)} \quad [EQ. 5]$$

The impedance, R, of the diode 108 may be expressed as an incremental change of voltage over an incremental change of time, as provided in Equation 6 below:

$$R=dV/dI=e^{(-a*v)}/(a*Is) \quad [EQ. 6]$$

The above expression can be solved for diode voltage verses resistance as provided by Equation 7 below:

$$V(R)=-\log(a*Is*R)/a \quad [EQ. 7]$$

Equation 6 can be substituted in the original diode I(V) Equation 1 above to provide the DC current to obtain a desired impedance R, as provided by Equation 8 below:

$$I(R)=1/(a*R)-Is \quad [EQ. 8]$$

Upon determining the current that flows through the diode D1 (108) to obtain the desired resistance, the shot noise may also be determined. The RMS shot noise current per root Hz is given by Equation 9 below:

$$I_{SHOT}/\sqrt{Hz}=\sqrt{2*q*I} \quad [EQ. 9]$$

This shot noise current may be converted to voltage by that same diode's differential impedance between the first node 102 and the second node 104. Accordingly, the voltage noise per root Hertz across the diode D1 (108) biased to an impedance R is provided by Equation 10 below:

$$V_{SHOT}/\sqrt{Hz} = R * \sqrt{2*q*1/a*R\cdot Is} \qquad [\text{EQ. 10}]$$

The ratio of shot noise to Johnson noise is provided by the expression of Equation 11 below:

$$\frac{V_{SHOT}/\sqrt{Hz}}{V_{John}/\sqrt{Hz}} = \sqrt{\frac{n}{2} - R*q*\frac{Is}{2*k*T}} \qquad [\text{EQ. 11}]$$

By way of demonstrative example, the expression of Equation 11 above can be approximated to equal $\sqrt{n/2}$ since $$R*q*\frac{Is}{2*k*T}$$

is small compared to $\sqrt{n/2}$. Since the emission coefficient "n" is approximately equal to 1, the biased diode D1 (108) has approximately 29% (or 3 dB) less noise than a conventional passive resistor. This result is independent of temperature. This result is independent of temperature. Many would find this an unexpected result since shot noise is generally understood to be independent of temperature while Johnson noise is generally understood to depend on temperature as in Equation 1. However, a diode becomes more nonlinear as the temperature decreases. Accordingly, the noise of the active resistor discussed herein goes down with temperature (as does the Johnson-Nyquist noise), since $$R*q*\frac{Is}{2*k*T}$$

is small compared to $\sqrt{n/2}$. Note that in the present example, $$R*q*\frac{Is}{2*k*T}$$

is 1.9e-8 compared to 0.707 for $\sqrt{n/2}$. However, in practice a different bias current as given in Equation 8 is used at each temperature to achieve the same differential resistance due to the dependence of a and Is on temperature.

The foregoing derivation is for the case of an ideal scenario (e.g., noiseless; current source and a diode with no terminal resistance). But the ideal performance indicated by the above theory is attainable with a practical circuit as confirmed by the applicant via an LTspice simulation performed at 27° C., n=1, Is=1 pA, and a resistance value R for the active differential resistor 100A to be 1KΩ based on the practical values depicted in FIG. 1A. In this regard it is noted that the LTspice simulator lends itself well for noise verification since Johnson-Nyquist and shot noises (e.g., their impact on circuit behavior) are computed from first principles. By way of practical example, the diode D1 (108) is assumed to be less than ideal in that it has 1Ω of series resistance. The current source 120 is implemented with a single resistor R1 110 and a voltage source 112 providing 5V.

By way of comparison, for a conventional 1KΩ passive resistor, the calculated Johnson-Nyquist noise is 4.0713715 nV/sqrt(Hz). The result of the LTspice simulation is 4.0713762 nV/sqrt(Hz), which confirms the calculation. In contrast, the calculated shot noise for the active differential resistor 100A of FIG. 1A is calculated to be 2.8788944 nV/sqrt(Hz). The result of the LTspice simulation is 2.8789013 nV, which confirms that calculation. Accordingly, the LTspice simulation confirms that a meaningful noise improvement can be obtained by using the active differential resistor 100A of FIG. 1A.

The applicant has discovered that some diode structures are more successful in reducing the Johnson-Nyquist noise than others. For example, a PIN diode is a diode that has a wide, un-doped intrinsic semiconductor region between a p-type semiconductor and an n-type semiconductor region. Thus, in contrast to ordinary PN junction diodes, the wide intrinsic region makes the PIN diode not only an inferior rectifier, but also does not provide substantial noise benefits. Indeed, since PIN diodes are more linear than a PN diode, they may not provide a meaningful noise benefit. Although there is a tradeoff between Johnson-Nyquist noise and shot noise, the shot noise introduced may be relatively high. That is because a PIN diode has a current versus voltage I(V) curve indicating an ideality factor N=2, implying that it has a large shot noise (e.g., which, in some scenarios, may be as large as the Johnson-Nyquist noise). Accordingly, the applicant has discovered that by using a regular PN junction diode, the foregoing disadvantage of a PIN diode is avoided.

Reference now is made to FIGS. 2A and 2B, which illustrate other embodiments of active differential resistors 200A and 200B that use a field effect transistor (FET) as an active component to implement an active differential resistor that may be used to replace a passive resistor. Active differential resistors 200A and 200B have substantially similar components except for different locations for a blocking capacitor (i.e., 206A and 206B). Accordingly, aspects of the active differential resistors 200A and 200B will be discussed in the context of 200A and will not be repeated for 200B for brevity. However, some of the differences will be highlighted.

Active differential resistor 200A includes a FET J1 (218), a first voltage source circuit 220, a second voltage source circuit 240, a feedback capacitor C2 (208), a blocking capacitor C3 (206A). In various embodiments, the FET J1 (218) may be a junction field effect transistor (JFET) or a metal oxide semiconductor field effect transistor (MOSFET).

In various embodiments, the blocking capacitor C3 (206A/B) may be coupled between a first node 202 and the drain of the FET J1 (218), as illustrated in FIG. 2A, or between the source of the FET J1 (218) and the second node 204 of the active differential resistor 200B, as illustrated in FIG. 2B.

The blocking capacitor C3 (206A/B) provides more flexibility (e.g., broader application) to the active differential resistor 200A/B in that it decouples the active differential resistor 200A/B from any circuit that is coupled between its differential inputs 202 and 204. Put differently, by virtue of the decoupling capacitor C3 (206A/B) the active differential resistor 200A/B can be used in different voltage environments. Thus, the drain 232 (or source 234) of the FET J1 (218) can be isolated from the actual voltage at the first node 202 or the second node 204. In one embodiment, the value of the blocking capacitor C3 (206A/B) is based on the lowest desired frequency of operation of the differential resistor 200A/B.

The active differential resistor 200A includes a first voltage source circuit 220 coupled across (e.g., in parallel with) the drain 232 and source 234 of the FET 218. Any suitable voltage source may be used to provide the drain 232 to source 234 bias voltage of the FET J1 (218). For example, the first voltage source may include a direct current voltage source 212 coupled in series with a resistor R3 (216). The active differential resistor 200A includes a second voltage source circuit 240 coupled between the gate and the source of the FET J1 (218). The second voltage source may include a direct current voltage source V2 coupled in series with a resistor R2 (210). It is believed that those skilled in the art are familiar with other suitable voltage source circuits, and they are therefore not discussed here in substantial detail for brevity.

The first and the second voltage sources 220 and 240 operate together to bias the FET J1 (218) to be in or near the saturation region such that the channel current noise is due to shot noise instead of Johnson-Nyquist noise. Put differently, the applicant has discovered that by virtue of biasing the FET J1 (232) to be in the saturation region, the FET J1 (232) acts as an active differential resistor that trades Johnson-Nyquist noise for shot noise, which provides an overall lower noise floor.

The larger the resistance of the resistor R3 (216), the lower the noise introduced by the resistor R3 (216) to the active differential resistor 200A. In one embodiment, the value of the resistor R3 (216) of the first voltage source circuit 220, is chosen to be higher than the desired impedance of the active differential resistor 200A. For example, the higher the value of the resistor R3 (216), the closer the active differential resistor 200A is in performance to the ideal performance limit.

However, the value of resistor R3 (216) should be low enough such that the voltage provided by the first voltage source circuit 240 can supply enough current into the drain of the FET J1 (218). Thus, the larger the resistance of resistor R3 (216), the larger the voltage drop across it, thereby reducing the voltage across the drain 232 to source 234 of the FET J1 (218). The resistance of resistor R3 (216) should be small enough such that the voltage across FET J1 (218) is large enough to keep the FET in saturation region. In this regard, it is noted that the saturation region of the FET J1 (218) is the where the drain 232 to source 234 current, for a given gate to source 234 voltage (which is supplied by the second voltage source circuit 240), does not substantially increase with an increase in a drain 232 to source 234 voltage (without reaching the breakdown region).

As to the resistance of the resistor R2 (210) of the second voltage source circuit 240, in one embodiment, should also be chosen to be higher than the desired impedance of the active differential resistor 200A. The value of the resistor R2 (210) may be set by the gate drive requirements of the FET J1 (218), which are typically very low in voltage.

In one embodiment, there is a feedback capacitor C2 (208) coupled between the gate and drain 232 of the FET J1 (218) configured to providing the appropriate impedance by reducing the impedance between the drain 232 and gate via feedback. At higher frequencies, the gate of the FET J1 (218) is shorted to the drain 232. In one embodiment, the feedback capacitor C2 (208) is coupled between the gate and the first node 202. The value of the feedback capacitor C2 (208) may be chosen such that it provides a low impedance at the lowest frequency of interest compared to the desired impedance of the active differential resistor 200A.

Similarly, in one embodiment, the value of the blocking capacitor C3 (206A/B) can be based on providing a low impedance at the lowest frequency at which the structure of FIG. 2A behaves as an active differential resistor. In this regard, it is noted that it may be desirable to have a low noise RC circuit operated at frequencies that are above and below the frequency set by the RC time constant of the blocking capacitor C3 (206A/B) and the resistance of the active differential resistor 200A/B.

FIGS. 2A and 2B illustrate, by way of example and not limitation, some component values that may be used to implement a 1KΩ active differential resistor at frequencies substantially above 159 Hz and as a capacitor at frequencies substantially below 159 Hz. For example, at 159 Hz, the impedance phase angle of the active differential resistor 200A or 200B is approximately 45 degrees.

By way of demonstrative example, FIG. 2A illustrates the differential impedance between the first node 202 and the second node 204 to be 1KΩ at frequencies of about 1 KHz. Significantly, the stochastic noise density across the first node 202 and the second node 204 is calculated to be only 3.333 nV/Hz$^{1/2}$, instead of 4.071 nV/Hz$^{1/2}$ of a conventional passive 1KΩ resistor. Thus, in this example, the improvement in noise is approximately 18% for a square law device, such as the FET J1 (218).

Figure 3A:
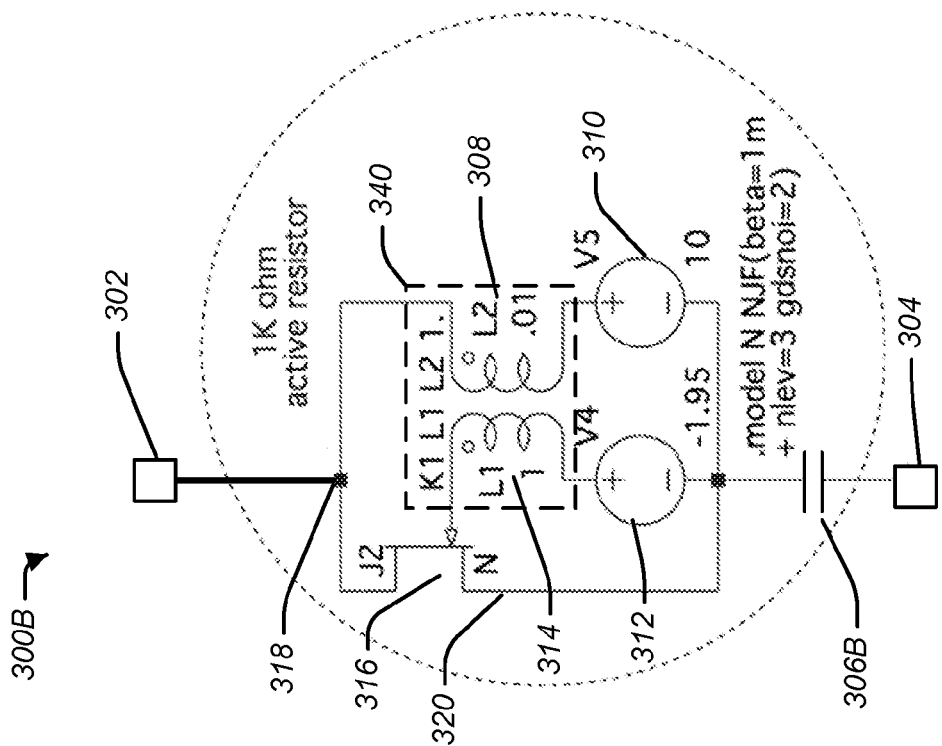
FIGS. 3A and 3B illustrate other embodiments of active differential resistors that use a FET and a transformer to implement an active differential resistor that may be used to replace a passive resistor.
Figure 3B:
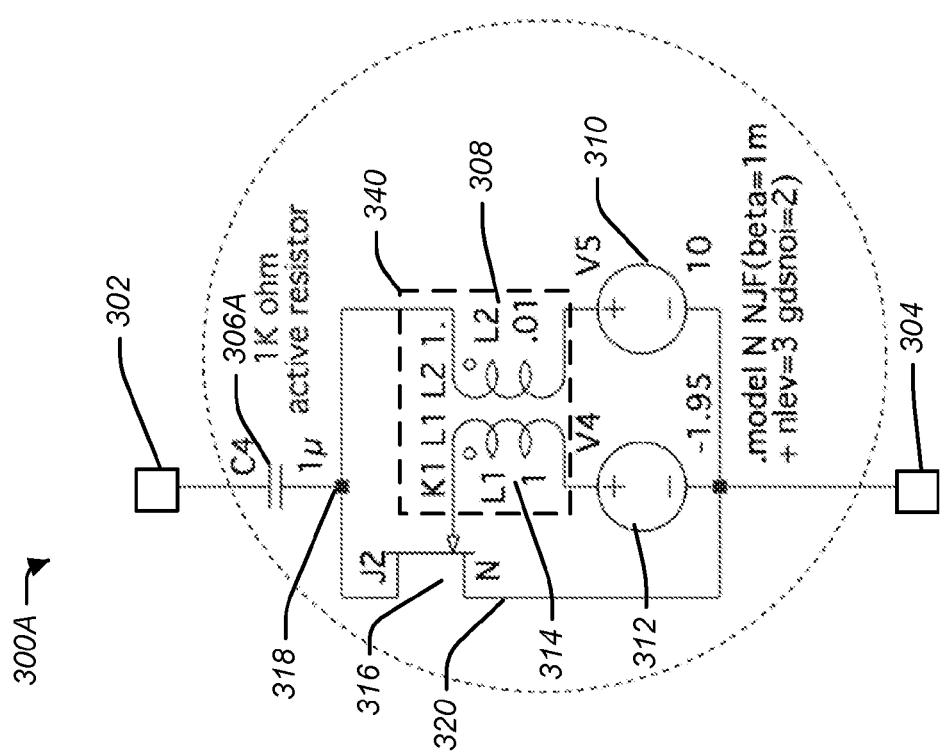

Reference now is made to FIGS. 3A and 3B, which illustrate other embodiments of active differential resistors 300A and 300B that use a field effect transistor (FET) and a transformer 340 to implement an active differential resistor that may be used to replace a passive resistor. Active differential resistors 300A and 300B provide a noise improvement over active differential resistors 200A and 200B and may be best appreciated in contrast to FIGS. 2A and 2B.

Active differential resistors 300A and 300B have substantially similar components to one-another, except for a different location of a blocking capacitor (i.e., 306A and 306B). Accordingly, aspects of the active differential resistors 300A and 300B will be discussed in the context of 300A and will not be repeated for 300B, for brevity. However, some of the differences will be highlighted.

Active differential resistor 300A includes a FET J2 (316), a transformer 330, a first voltage source 312, a second voltage source 314, and a blocking capacitor C4 (306A). In various embodiments, the FET J2 (316) may be a JFET or a MOSFET.

In various embodiments, the blocking capacitor C4 (306A/B) may be coupled between a first node 202 and the drain 318 of the FET J2 (216), as illustrated in FIG. 3A, or between the source 320 of the FET J2 (216) and the second node 304 of the active differential resistor 300B, as illustrated in FIG. 3B.

The blocking capacitor C3 (306A/B) provides more flexibility (e.g., broader application) to the active differential resistor 300A/B in that it decouples the active differential resistor 300A/B from any circuit that is coupled between its differential inputs 302 and 304. Put differently, by virtue of the decoupling capacitor C3 (306A or 306B) the active differential resistor 300A/B can be used in different voltage environments. Thus, the drain 318 (or source 320) of the FET J2 (316) can be isolated from the actual voltage at the first node 302 or the second node 304. In one embodiment, the value of the blocking capacitor C4 (306A/B) is based on the lowest desired frequency of operation of the differential resistor 300A/B.

The transformer 340 includes a primary winding L1 (314) that has a first end coupled to the gate and a second end coupled to the source of the FET J2 (316) via a first voltage source V4 (312). The secondary winding 308 has a first end that is coupled to the drain and a second end coupled to the source of the FET J2 (316) via a second voltage source V5 (310). The transformer is configured to provide impedance to the drain 318 of the FET J2 (316).

The active differential resistor 300A includes a first voltage source 312 coupled between the second end of the primary winding L1 (314) and the source of the FET J2 (316). There is a second voltage source V5 (310) coupled between the second end of the secondary winding L2 (308) and the source of the FET J2 (316). Any suitable voltage source may be used to implement these voltage sources of FIGS. 3A and 3B. It is believed that those skilled in the art are familiar with other suitable voltage source structures, and they are therefore not discussed here in substantial detail, for brevity.

The first and the second voltage sources 312 and 310 operate together to bias the FET J2 (316) to be in or near the saturation region such that the channel current noise is due to shot noise instead of Johnson-Nyquist noise. Accordingly, the applicant has discovered that by virtue of biasing the FET J2 (316) to be in or near the saturation region, the FET J2 (316) acts as an active differential resistor that trades Johnson-Nyquist noise for shot noise, which provides a lower noise floor. Further, by virtue of using a transformer 340, the nonlinearity of the FET J2 (316) is further exacerbated, thereby providing more tradeoff between the Johnson-Nyquist noise and shot noise. For example, for the same change in voltage provided by second voltage source V5 (310) to the drain 318 to source 320, there is a larger change in voltage from the gate to source 320.

FIGS. 3A and 3B illustrate, by way of example and not limitation, some component values that may be used to implement a 1KΩ active differential resistor at frequencies that are above 100 KHz. For example, an inductance ratio of L1 to L2 of 1:.01 (e.g., 1:100) ratio could be used, which provides a turn's ratio of $(100)^{1/2}=1:10$. Significantly, the noise density above 100 kilohertz is only 1.058 nV/Hz$^{1/2}$. Thus, the embodiment of FIG. 2A (or 2B) may provide 74% less noise than a conventional passive resistor. That is because the problematic Johnson-Nyquist noise is exchanged with the more manageable shot noise. In this regard, it is noted that the improvement in noise reduction may increase with the turns ratio of the transformer. The useable bandwidth of the low noise active differential resistor can be adjusted by the transformer inductance and the blocking capacitor value 306A/B, using well known circuit analysis techniques such the complex impedance law and nodal analysis.

Applications

The Johnson-Nyquist noise is generally regarded to be the fundamental noise limit of a device with an IV curve following Ohm's Law. By virtue of being unshackled by the above constraint based on the concepts discussed herein, a differential resistor with less noise can be enjoyed by countless applications. For example, an active differential resistor discussed herein may be used in the context of quiet termination in transmission line systems with low level signals, automatic test equipment of electronic amplifiers that allow input termination of a low noise resistor to facilitate measuring the current noise of the amplifier without combining Johnson-Nyquist noise from the test fixture, physical sensors, etc.

For example, many physical sensors provide a current in response to a sensed physical quantity. The signal amplitude may be proportional to the termination impedance. However, such terminating impedance may supply undesired noise to the signal. The active differential resistors that have been described herein may reduce the amount of noise supplied by such termination.

Figure 4:
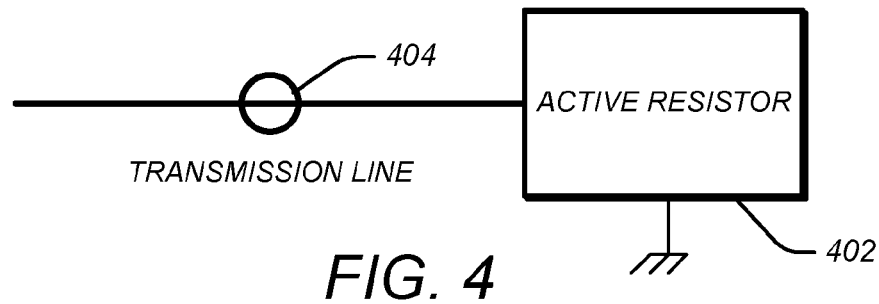
FIG. 4 illustrates an example of an active differential resistor connected across an end of a transmission line and configured to operate as a low noise termination of that line.

FIG. 4 illustrates an example of an active differential resistor 402 connected across an end of a transmission line 404 and configured to operate as a low noise termination of that line.

Figure 5:
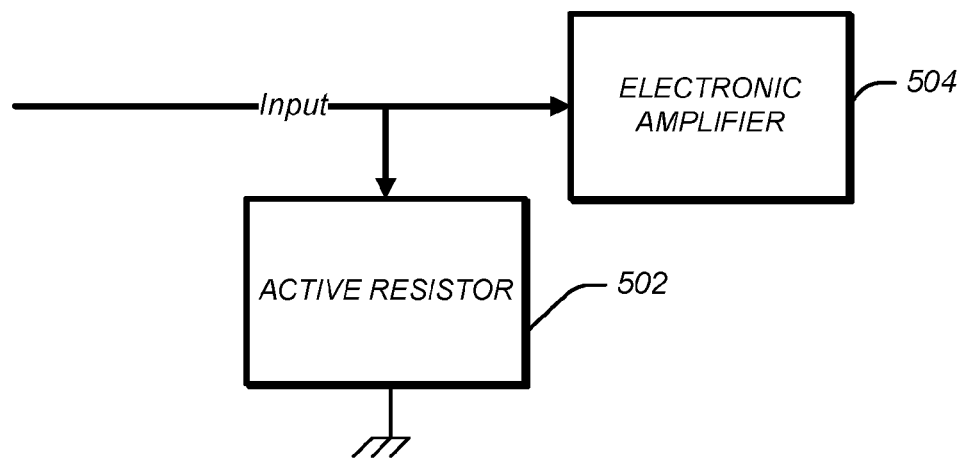
FIG. 5 illustrates an example of an active differential resistor connected across an input of an electronic amplifier and configured to operate as part of an automated test equipment that determines a level of noise generated by the electronic amplifier.

FIG. 5 illustrates an example of an active differential resistor 502 connected across an input of an electronic amplifier 504 and configured to operate as part of an automated test equipment that determines the level of noise generated by the electronic amplifier.

Figure 6:
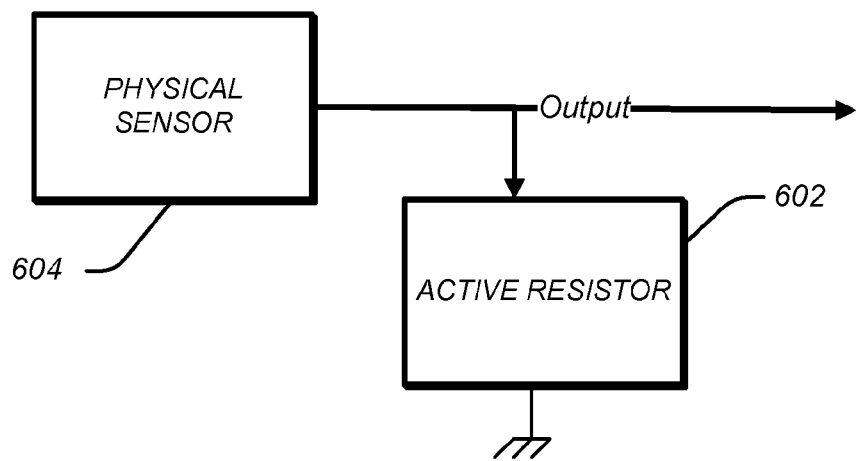
FIG. 6 illustrates an example of an active differential resistor connected across an output of a physical sensor.

FIG. 6 illustrates an example of an active differential resistor 602 connected across an output of a physical sensor 604, such as a capacitance microphone. In various embodiments, the active differential resistors illustrated in FIGS. 4 to 6 may be any of the type described herein.

The benefits of the concepts discussed herein may be further appreciated by way of comparative example. In a regular microphone system, a soundwave moves the diaphragm of the microphone, where the change in distance between the two charge bearing surfaces of the microphone provides a voltage. This voltage (representing the sound signal) may be of small amplitude (e.g., in the mV range). The larger the resistance that is used at the output of the microphone sensor, the lower the noise in the system because the signal to noise ratio improves. However, Johnson noise is added at the square root of the resistance. Thus, the signal to noise ratio improves with the square root of the resistance value. Put differently, a larger resistance is typically preferred. However, a large resistance may lead to a larger time constant because of the capacitive element of the microphone, thereby reducing the bandwidth. Thus, while in traditional microphone systems larger value resistors may be preferred to reduce the noise in a microphone system, it comes at the cost of reduced bandwidth.

However, using the concepts discussed herein, a lower resistance value could be used, thereby dramatically improving the bandwidth of the microphone, while maintaining or even lowering the signal to noise ratio of the microphone system.

CONCLUSION

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, the diodes of FIGS. 1A and 1B can be any PN junction, such as the base-emitter junction of a bipolar transistor, the PN junction of a JFET, the PN junction between the drain/source and substrate of a MOSFET, etc. Additionally, the biasing of any embodiment shown can be electronically controlled to make the resistance of the active differential resistor electronically controlled.

Unless otherwise stated, all measurements, values, ratings, positions, magnitudes, sizes, and other specifications that are set forth in this specification, are approximate, not exact. They are intended to have a reasonable range that is consistent with the functions to which they relate and with what is customary in the art to which they pertain.

Except as stated immediately above, nothing that has been stated or illustrated is intended or should be interpreted to cause a dedication of any component, step, feature, object, benefit, advantage, or equivalent to the public, regardless of whether it is or is not recited in the claims.

All articles, patents, patent applications, and other publications that have been cited in this disclosure are incorporated herein by reference.

It will be understood that the terms and expressions used herein have the ordinary meaning as is accorded to such terms and expressions with respect to their corresponding respective areas of inquiry and study except where specific meanings have otherwise been set forth herein. Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An active differential resistor, comprising:
   an input node and an output node operative to provide a differential resistance;
   a diode having a first node and a second node;
   a capacitor coupled in series between the first node of the diode and the input node; and
   a current source coupled across the first node and the second node of the diode and configured to forward bias the diode such that a Johnson-Nyquist noise of the active differential resistor is replaced by a shot noise.

2. The active differential resistor of claim 1, wherein the first node of the diode is a cathode and the second node of the diode is an anode.

3. The active differential resistor of claim 1, wherein the first node of the diode is an anode and the second node of the diode is a cathode.

4. The active differential resistor of claim 1, wherein the current source comprises a voltage source in series with a resistor.

5. The active differential resistor of claim 1, wherein the capacitor is configured to decouple the active differential resistor from a circuit coupled between the input node and the output node, such that the active differential resistor can operate in a voltage environment that is independent of the circuit coupled thereto.

6. The active differential resistor of claim 1, wherein a capacitance of the capacitor is based on a lowest desired frequency of operation of the active differential resistor for a predetermined resistance between the input node and the output node.

7. The active differential resistor of claim 1, wherein:
   the diode comprises a junction gate field-effect transistor (JFET), and
   a drain and a source of the JFET are connected together.

8. The active differential resistor of claim 1, wherein:
   the diode comprises a p-channel JFET;
   a gate of the p-channel JFET is operative as a cathode of the diode; and
   at least one of: (i) a drain and (ii) a source of the p-channel JFET, are operative as an anode of the diode.

9. The active differential resistor of claim 1, wherein:
   the diode comprises an n-channel JFET;
   a gate of the n-channel JFET is operative as an anode of the diode; and
   at least one of: (i) a drain and (ii) a source of the p-channel JFET, are operative as a cathode of the diode.

10. The active differential resistor of claim 1, wherein:
    the diode comprises a monolithic insulated gate field effect transistor (MOSFET); and
    a drain, a source, and a gate of the MOSFET are connected together.

11. The active differential resistor of claim 1, wherein:
    the diode comprises a vertical field effect transistor (VDMOS); and
    a gate and a source of the VDMOS are connected together.

12. The active differential resistor of claim 1, wherein the differential resistance of the active differential resistor is based on a current of the current source.

13. The active differential resistor of claim 1, wherein a capacitance of the capacitor is based on a lowest desired frequency of operation of the active differential resistor for a predetermined resistance between the input node and the output node.

14. A method of providing an active differential resistance between an input node and an output node, comprising:
    forward biasing a diode coupled between the input node and the output node such that a Johnson-Nyquist noise of the active differential resistance is replaced by a shot noise; and
    coupling a capacitor between the input node and a first node of the diode.

15. The method of claim 14, wherein the diode comprises a junction gate field-effect transistor (JFET); and
    further comprising connecting a drain to a source of the JFET.

16. The method of claim 15, wherein the JFET is a p-channel JFET; and further comprising:
    operating a gate of the p-channel JFET as a cathode of the diode; and
    operating at least one of: (i) a drain and (ii) a source of the p-channel JFET, as an anode of the diode.

17. The method of claim 15, wherein the JFET is an n-channel JFET; and further comprising:
    operating a gate of the n-channel JFET as an anode of the diode; and
    operating at least one of: (i) a drain and (ii) a source of the p-channel JFET, as a cathode of the diode.

18. The method of claim 14, wherein the diode comprises a monolithic insulated gate field effect transistor (MOSFET); and further comprising
    connecting together a drain, a source, and a gate of the MOSFET.

19. The method of claim 14, wherein the diode comprises a vertical field effect transistor (VDMOS); and further comprising connecting a gate to a source of the VDMOS.

20. The method of claim 14, further comprising programming the differential resistance of the active differential resistor based on a current of a current source providing the forward biasing.

21. The method of claim 14, wherein the current source comprises a voltage source in series with a resistor.

22. The method of claim 14, further comprising decoupling, by the capacitor, the active differential resistance from a circuit connected between the input node and the output node, such that the active differential resistor can operate in a voltage environment that is independent of the circuit coupled thereto.

23. An active differential resistor, comprising:
- an input node and an output node operative to provide a differential resistance;
- a means of providing a unidirectional current having a first node and a second node;
- a capacitor coupled in series between the first node of the means of providing the unidirectional current and the input node; and
- a second means of providing a current coupled across the first node and the second node of the means of providing the unidirectional current, and configured to forward bias the means of providing the unidirectional current, such that a Johnson-Nyquist noise of the active differential resistor is replaced by a shot noise.

* * * * *